United States Patent
Shepherd et al.

(10) Patent No.: US 6,465,739 B1
(45) Date of Patent: Oct. 15, 2002

(54) VERY HIGH TEMPERATURE AND ATMOSPHERIC PRESSURE SUPERCONDUCTING COMPOSITIONS AND METHODS OF MAKING AND USING SAME

(75) Inventors: Basil D. Shepherd, Cheltenham (GB); David L. Shaw, Cheltenham (GB)

(73) Assignee: Finch International Limited, Dublin (IL)

( * ) Notice: Subject to any disclaimer, the term of this patent is extended or adjusted under 35 U.S.C. 154(b) by 0 days.

(21) Appl. No.: 08/301,501

(22) Filed: Sep. 7, 1994

Related U.S. Application Data

(62) Division of application No. 08/172,024, filed on Dec. 21, 1993.

(51) Int. Cl.[7] .............................................. H01B 12/00
(52) U.S. Cl. .................... 174/125.1; 505/100; 505/110; 505/775
(58) Field of Search ....................... 174/125.1; 505/100, 505/110, 775, 779, 780

(56) References Cited

U.S. PATENT DOCUMENTS

| | | | |
|---|---|---|---|
| 4,839,339 A | 6/1989 | Bunker et al. | 505/510 |
| 4,859,652 A | 8/1989 | Block | 505/441 |
| 4,892,862 A | 1/1990 | Ogushi et al. | 505/473 |
| 4,931,426 A | 6/1990 | Mihalich | 505/483 |
| 4,960,752 A | 10/1990 | Ashok et al. | 505/470 |
| 4,965,244 A | 10/1990 | Weaver et al. | 505/473 |
| 4,970,195 A | 11/1990 | Bhargava et al. | 505/420 |
| 4,983,574 A | 1/1991 | Meyer | 505/124 |
| 4,990,489 A | 2/1991 | Mashiko et al. | 505/170 |
| 5,002,648 A | 3/1991 | Morach et al. | 204/192.1 |
| 5,017,548 A | 5/1991 | Hirakawa et al. | 505/401 |
| 5,032,569 A * | 7/1991 | Kaldis et al. | 505/482 |
| 5,037,801 A | 8/1991 | Kloucek | 505/430 |
| 5,055,436 A | 10/1991 | Klemptner et al. | 505/445 |
| 5,071,828 A | 12/1991 | Greuter et al. | 505/425 |

(List continued on next page.)

FOREIGN PATENT DOCUMENTS

| | | |
|---|---|---|
| GB | 2211497 A | 10/1988 |
| JP | 89-081067/11 | 2/1989 |
| JP | 89-125273/17 | 3/1989 |
| JP | A 122921 | 5/1989 |
| JP | A 167289 | 6/1989 |
| RU | 4837072 | 3/1990 |
| RU | 93000556 | 1/1993 |

OTHER PUBLICATIONS

Research News "A Big Step for Superconductivity?" Science, vol. 262, Dec. 17, 1993, pp. 1816–1817.*
*New Scientist,* Science, Oct. 2, 1993, (p. 14).
"High Temperature Superconductors," CRC *Handbook of Chemistry and Physics,* 1993–1994 Ed., pp. 12–76.
Obolenskii, M.A. et al., *Prog. High Temp. Supercond.,* 1992 vol. 32 Number: High Temp. Supercond. Localization Phenom. pp. 786–790 article "Chalcogenide analogs of HTSC".
Kulakov, M.P. et al., *Neorgan. Mater.,* 1991 vol. 27 No.: 9 pp. 1954–1957 article "Phases in yttrium–barium–copper–chalcogen–(X) systems (X=S, Se, Te)".

*Primary Examiner*—Albert W. Paladini
(74) *Attorney, Agent, or Firm*—Shoemaker and Mattare

(57) ABSTRACT

Ceramic compositions which exhibit the phenomenon of superconductivity are disclosed. Methods of making and using the compositions are included. The compositions comprise 1-2-3 ceramic compositions (e.g., Y, Ba, Cu/Ag) with the fourth constituent comprising sulfur, selenium or tellurium. Unexpectedly high temperature (e.g., non-cryogenic) and essentially atmospheric pressure superconductor characteristics are shown.

11 Claims, 3 Drawing Sheets

U.S. PATENT DOCUMENTS

| | | | |
|---|---|---|---|
| 5,071,833 A | 12/1991 | Laine et al. | 505/430 |
| 5,079,216 A | 1/1992 | Henty | 505/191 |
| 5,093,310 A | 3/1992 | Rosen | 505/320 |
| 5,114,914 A | 5/1992 | Sablik et al. | 505/490 |
| 5,116,810 A | 5/1992 | Joshi et al. | 505/500 |
| 5,130,273 A | 7/1992 | Mashiko et al. | 505/330 |
| 5,138,326 A | 8/1992 | Edwards et al. | 324/319 |
| 5,140,003 A | 8/1992 | Mueller | 505/447 |
| 5,140,290 A | 8/1992 | Dersch | 505/211 |
| 5,143,897 A | 9/1992 | Ziemek et al. | 505/431 |
| 5,145,832 A | 9/1992 | Harshavardhhan et al. | 505/237 |
| 5,164,359 A | 11/1992 | Calviello et al. | 505/330 |
| 5,177,055 A | 1/1993 | Kinsman et al. | 505/510 |
| 5,179,074 A | 1/1993 | Fiedziuszko et al. | 505/210 |
| 5,183,799 A | 2/1993 | Ogushi et al. | 505/110 |
| 5,196,379 A | 3/1993 | Weaver et al. | 505/473 |
| 5,196,397 A | 3/1993 | Rosen | 505/126 |
| 5,206,215 A | 4/1993 | Duperray et al. | 505/512 |
| 5,219,832 A | 6/1993 | Zhou | 505/310 |
| 5,223,478 A | 6/1993 | Whitlow et al. | 505/432 |
| 5,231,073 A | 7/1993 | Cohn et al. | 505/475 |
| 5,244,876 A | 9/1993 | Preisler et al. | 505/450 |
| H001718 H | 4/1998 | Ferrando et al. | |

* cited by examiner

VERY HIGH TEMPERATURE AND ATMOSPHERIC PRESSURE SUPERCONDUCTING COMPOSITIONS AND METHODS OF MAKING AND USING SAME

CROSS-REFERENCE TO RELATED APPLICATION

This application is a divisional application of Ser. No. 08/172,024, filed Dec. 21, 1993, entitled Very High Temperature and Atmospheric Pressure Superconducting Compositions and Methods of Making and Using Same.

TECHNICAL FIELD

This invention relates to ceramic materials and to methods for making and using such materials. More specifically, this invention relates to ceramic materials having surprising and unexpected diamagnetic moments. Yet even more specifically, this invention relates to ceramic materials which exhibit extremely low resistance to the passage of electrical current at very high temperatures and at atmospheric pressure. Essentially, this invention relates to very high temperature superconducting compositions and to methods of making and using same.

BACKGROUND OF THE INVENTION

Materials which exhibit the phenomenon of total diamagnetism at non-cryogenic temperatures and easily attainable pressures have been the subject of considerable research interest for a significant period of time. That research, which has been referred to as "high temperature superconductor" research, has focused upon the resistive and diamagnetic properties of the materials of interest at 23 degrees Kelvin (K) and above (i.e., 23 degrees above absolute zero). In other words, "high temperature", as that term has been used in the past, referred to temperatures only attainable under extremely cold, namely, cryogenic conditions.

A major advance in the world of superconducting compositions is described in the popular novel, *The Breakthrough the Race for the Superconductor* written by Robert M. Hazen. *The Breakthrough* describes the massive scientific effort that was generated when, in 1986, George Bednorz and Alex Muller reported synthesis and testing of a Ba—La—Cu—O composition which exhibited superconductive behavior at 30 degrees K ("Possible High Tc Superconductivity in the Ba—La—Cu—O System" in *Zeitschrift fur Physik*, November, 1986). For their efforts, Bednorz and Muller received the Nobel Prize in physics in 1987. Having shown that the perceived 23 degree K barrier could be broken, the work of Bednorz and Muller spurred the research efforts of many other researchers at several other research laboratories.

Subsequent to the work of Bednorz and Muller, several other researchers synthesized and tested compositions which exhibit superconductive characteristics in the "high temperature" range as that was understood at the time. In other words, those materials exhibited superconductive characteristics at critical temperatures, Tc, of greater than 23 K. As discussed in *Breakthrough,* Paul Chu (Paul Ching-Wu) and his colleagues synthesized and tested an yttrium, barium, copper system (subsequently known as "1-2-3" reflecting the atomic ratios of the substances) which exhibited Tc of greater than 70 degrees K. This was an important breakthrough because it permitted the creation of superconducting behavior at about the boiling temperature of liquid nitrogen, i.e., 77 degrees K. This achievement (which was characterized as the equivalent of breaking the 4-minute mile in distance racing) permitted research and applications work to proceed using inexpensive, easily handled cryogenic fluid, liquid nitrogen. Research at liquid nitrogen temperatures and above is one of the factors which permitted the phenomenon of superconductivity to emerge from the stage of laboratory curiosity and to begin its journey to practical application.

In their efforts to understand superconductivity better and thereby, potentially, to increase Tc to even more useful ranges, Chu and others began evaluating superconductor candidates at elevated pressures. At pressures in excess of 10,000 atmospheres ($1\times10^7$ k-Pascals), shifts in $T_c$, either up or down, were regularly observed. As recently as Feb. 10, 1993 Chu has reported (in *New Scientist,* p. 14) a Tc of 160 degrees K at a pressure of more than 150,000 atmospheres with respect to a $HgBa_2Ca_2Cu_3$ material. Mercury superconductors were apparently first identified by the CNRS French national research organization in early 1993, c.f. *New Scientist,* Science, 27 March 1993.

In the first instance, even though considerably more convenient than early superconductor work, cryogenic equipment needed to handle liquid nitrogen at 77 K is expensive, cumbersome, and potentially dangerous. This is particularly true of commercial applications of superconductor materials where cumbersome, expensive, and inconvenient cryogenic equipment is needed to cool the superconductor material to create the desired superconductivity. Clearly, applications which required super atmospheric pressures to reveal the desired elevated Tc would additionally complicate utilization of superconductor compositions as well as increase the expense and inconvenience of doing so.

Also of note is the fact that most materials which have been shown to exhibit superconductivity are oxides. Table 1 entitled "LHigh Temperature Superconductors" at page 12–76 of the 1993–1994 edition of the CRC *Handbook of Chemistry and Physics* lists approximately 30 materials, only one of which ($Rb_2CsC_{60}$) is not an oxide. (Table 1 indicates preparation in November, 1992.) That non-oxide composition employs carbon, which itself likely has characteristics similar to those exhibited by the metals which comprise the rest of the materials. The highest Tc listed in the above-mentioned Table 1 is 128 degrees Kelvin for a $Tl_2Ca_2Ba_2Cu_3O_{10}$ system.

There is, therefore, a critical need for a material which exhibits superconductivity at non-cryogenic temperatures (i.e., above about 273 degrees K) and substantially atmospheric pressure. This invention describes such a material.

BRIEF DESCRIPTION OF THE INVENTION

The present invention is a ceramic composition which exhibits diamagnetic behavior and electrical resistivity, indicating that it is a superconductor. A material of this invention exhibits these properties at a wide range of temperatures and pressures, most notably, at room temperature and atmospheric pressure. In its preferred practice, this invention is a composition that exhibits all the attributes of superconductivity at room temperature and atmospheric pressure. Reduced to its essentials, this invention is the next revolution in superconductivity. It begins the era of what will hereinafter be defined as very High Temperature Superconductors (VHTS).

Briefly, the present invention, in one aspect, is a method for conducting electricity utilizing a superconducting ceramic material at a temperature which is greater than 193 degrees K, a pressure which is less than 150,000 atmospheres. Generally, such materials will have a resistivity of less than $1 \times 10^{-8}$ ohm-meters. For all purposes herein, superconductivity at a temperature in excess of 193 degrees K will be considered VHTS. Preferably, a method of this invention involves conducting electricity at a temperature in excess of about 270 degrees K. More preferably, a method of this invention involves conducting electricity at a temperature in the range of about 273 degrees K to about 373 degrees K, without cryogenic cooling, at a pressure in the range of 0.1 to about 10 atmospheres, under conditions of superconductivity. Most preferably, the present method involves the method of conducting electricity at about room temperature, i.e., about 300 degrees K, atmospheric pressure, under conditions of superconductivity.

In another aspect, the present invention is a ceramic material which exhibits superconductor characteristics within the above-defined pressure and temperature ranges, the material comprising:

$$MM'_2M''_3Z_{a-b}$$

wherein:

M is a metal selected from the group consisting of the elements Y, La, Tl, and mixtures thereof;

M' is a metal selected from the group consisting of Ba, Ca, and mixtures thereof;

M" is a metal selected from the group consisting of Ag, Cu, Au, Rb, Cs, K, and mixtures thereof;

Z is selected from the group consisting of S, Te, and Se; wherein a is an integer having a value between 2 and 10, preferably between 5 and 8, and b is in the range of about 0 to about 0.5.

In a preferred practice of this invention, M is Y (i.e., yttrium), M' is Ba, M" is either Cu or Ag, Z is either Se or Te, a has a value of about 7 and b is in the range of about 0 to about 0.5.

In yet a further preferred practice of this invention, M is Y, M' is Ba, M" is either Cu or Ag, and Z is Se.

"Superconductive" or "superconducting" as the term is used herein is defined to mean, having the property of passing electronic currents without an observable energy interchange occurring between current carriers (e.g., electrons) and lattice structures. Superconduction is observed when the flow of current fails to generate an observable accompanying voltage gradient. Currents passing through a superconductor will persist substantially indefinitely. Therefore, a nondegrading magnetic field will be observed due to this current. A superconductive material will be substantially diamagnetic.

BRIEF DESCRIPTION OF THE FIGURES

The invention will now be illustrated by reference to the detailed description below and the attached Figures wherein.

DETAILED DESCRIPTION OF THE INVENTION AND EXAMPLES

Figure 1:
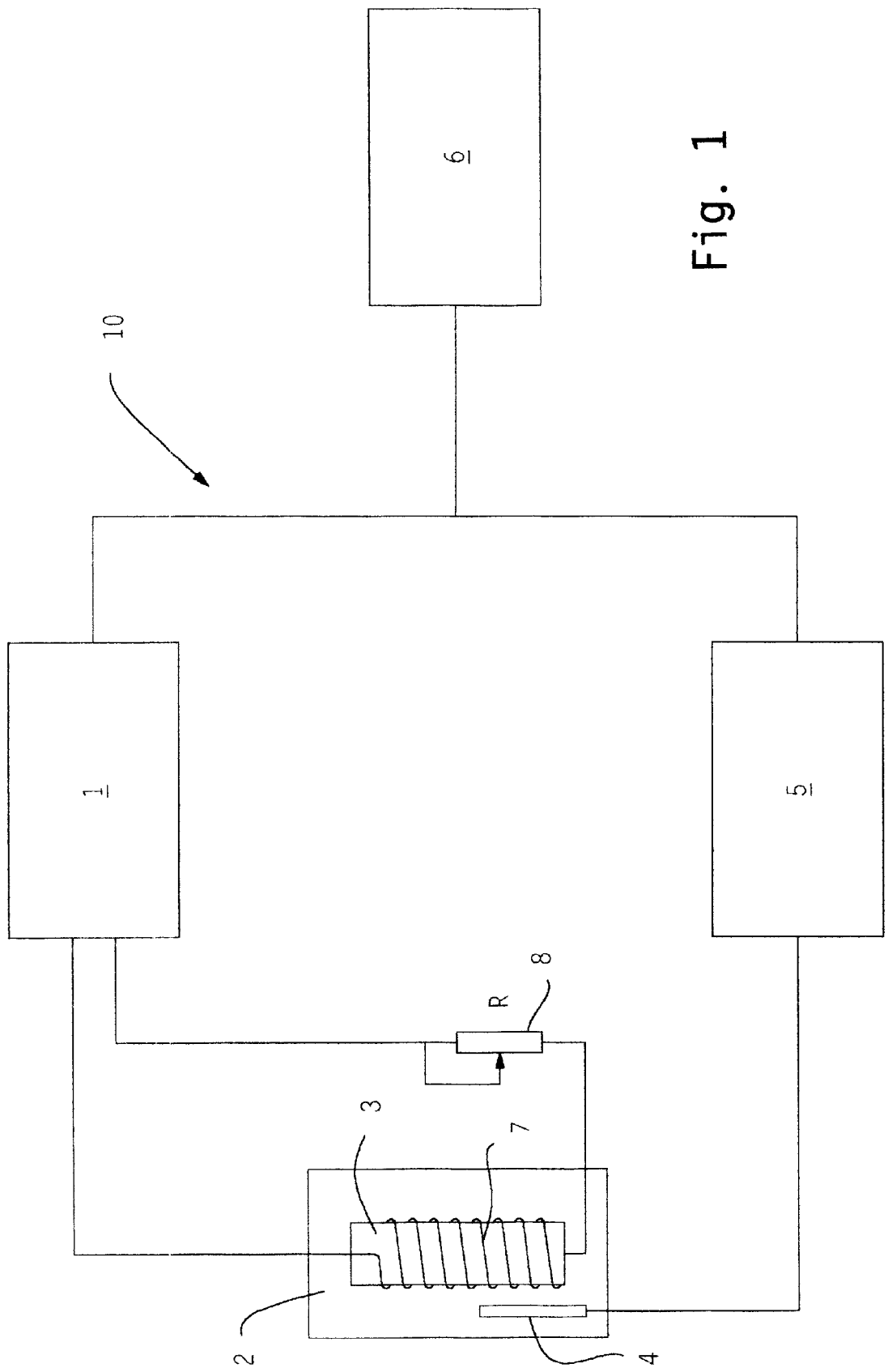
FIG. 1 is an electrical schematic of the circuit used to measure the properties of the materials of this invention.

The applications for the materials and methods of this invention are potentially all-encompassing. The inexpensive transmission of power is one primary application. The conduction of electricity, under conditions or superconductivity, without the cryogenic equipment required of prior art processes will significantly impact many of the cost assumptions of the electrical power industry. The costs of electricity transmission can be considerably reduced by elimination of the power loss experienced with metallic wire conductors. Indefinite storage of electricity for peak demand periods, e.g., in storage rings, also becomes possible.

There are many applications for this invention in the computer industry. VHTS materials and methods permit smaller and faster computers to be built, there being less concern about overheating.

Magnet technology can most certainly benefit by utilization of this invention. Superconducting magnets are known to be significantly superior to conventional magnets, especially for high field applications. Superconducting magnets employing the teachings of this invention obviously could be built much more cheaply. Such magnets could be used in superconductor motors, low friction magnetically suspended cars and trains, and many other such applications.

Syntheses of Ceramic Materials of the Invention

Once the materials of this invention are described, various synthetic routes are likely to be suggested. Two routes to synthesize materials of this invention are here described. In one of the processes, a 1-2-3- yttrium, barium, copper oxide compound is synthesized or obtained and treated according to the options specified herein in the solid phase or gas phase to produce materials of the invention. In a second synthetic process, VHTS is synthesized from intermediates by mixing the main phases in plasma. Both processes produce a VHTS powder. The synthesis steps are followed by pressing of the powder produced into tablets, which are then annealed and thereafter the connecting of electrodes and terminals to the tablet to test its properties or testing the synthesized powder by contactless methods.

Synthesis of VHTS is a physical and chemical process controlled by both conventional X-ray phase and X-ray spectral microanalysis, material composition and stoichiometry, thermogravitational and laser-fluorescent analysis. Scanning electron microscopes, and neutron activation analysis for traces of oxygen or fluorine also may be employed.

Only chemically pure substances or intermediate products should be used in the synthesis. Control of the 10 to 15 main trace elements may be monitored using such techniques as electro-paramagnetic resonance (EPR) and nuclear magnetic resonance (NMR). Use of high purity substances, accuracy and constant process control are required to synthesize ceramic materials which exhibit the phenomena disclosed herein.

The synthesis of VHTS generally involves the following operations:

1. obtaining or generating initial or intermediate products or agents (purification, treatment, separation);
2. Preparation of a mixture for synthesizing VHTS of the desired stoichiometry;
3. Thermal treatment of yttrium, barium and copper oxides in an excess oxygen flux (0.1 atm excess pressure) at a temperature of up to about 1120 degrees Celsius to produce a 1-2-3 cohesive intermediate mass, followed by milling and magnetic and phase separation to obtain a single phase 1-2-3 compound;
4. Thermal treatment of the single phase 1-2-3 oxygen compound with sulphur, selenium or tellurium oxides, in a controlled environment at a temperature of about 400 degrees Celsius to about 600 degrees Celsius for about 4 to 5 hours, to produce the VHTS compound(s). Following milling, the magnetic susceptibility of the powder material can be examined at this time using contactless methods;

5. Production of tablets and controlled annealing of tablets at a temperature in the range about 700 degrees Celsius to about 1120 degrees Celsius to produce VHTS tablet;

6. Connecting electrodes to VHTS tablets for evaluation of resistivity as a function of temperature in a device substantially as schematically shown in FIG. 1.

At each stage of the synthesis, magnetic separation is employed to exclude ferromagnetic impurities and phase separation techniques are implemented.

VHTS based on sulphides, tellurides, and selenides of yttrium, barium, copper and silver are synthetic, thinly dispersed powders (or compressed tablets). The physical parameters of VHTS powder are shown in Table 1.

TABLE 1

Properties of VHTS

| Parameters | VHTS Based on Sulphides | VHTS Based on Selenides | VHTS Based on Tellurides |
|---|---|---|---|
| Color | Greyish-black (Ag) Black (Cu) | Dark Grey (Ag) Black (Cu) | Dark Grey (Ag) Black (Cu) |
| Average Grain Size | ~40 micron | ~40 micron | ~40 micron |

The primary processing steps for VHTS production are generally noted above. Stoichiometric amounts of all components necessary for preparation of the material are weighed on analytical scales (with accuracy of $10^{-3}$ g) and put into a jasper ball mill for uniform mixing (ball to components ratio about 2:1). Mixing time is about two hours at 60 rpm. The powdered mixture produced is sieved through nylon sieve and loaded in thoroughly rinsed Alundum crucibles.

Crucibles about 90 mm high and about 60 mm in diameter are used for baking the oxygen-containing mixture. Up to about ⅔ of the crucible's height is loaded at one time.

Crucibles containing the mixture are put into an electric furnace in oxygen flux (P excess=0.1 atm) with temperature increased as required to 1120 degrees Celsius.

The obtained mixture is thoroughly ground, sieved and fractionated with an air classifier.

Repeating the process outlined above may be necessary to obtain pure monocrystal 1-2-3 phase (r=4.9–5 g/cm$^3$).

The resultant 1-2-3 powder is then thoroughly mixed and saturated with sulfur, selenium or tellurium oxides as appropriate, placed in a crucible which is heated in an electric furnace containing an excess pressure of inert gas, i.e., 0.1 atmospheres or thereabouts of nitrogen gas. The furnace temperature is raised to between about 400 degrees Celsius and about 600 degrees Celsius for about 4 to 5 hours in order to achieve the necessary gas phase oxydation-reduction reaction. If necessary, e.g., in order to ensure total displacement of the oxygen in the ceramic material, the operation is repeated.

Products of the reaction are milled and sieved through a nylon sieve. The powder is separated as to size of particulates, magnetic properties and phases and thereafter controlled for S, Se, Te content. The resultant powder can then be examined for diamagnetic properties and formed into a tablet.

Annealing of a tablet is achieved by totally immersing it in a mixture consisting of 1-2-3 powder+Mz+M'Z in a crucible which is placed in an electric furnace containing an excess pressure of nitrogen gas, i.e., 0.1 atmospheres or thereabouts for solid phase diffusion reaction. The furnace temperature is raised to between about 700 degrees Celsius and about 1120 degrees Celsius and maintained for about 2 to 4 hours.

It is now possible to connect electrodes to VHTS tables for evaluation of resistivity as a function of temperature.

Evaluation of VHTS Ceramic Materials

Conventional evaluation methods are not well suited to evaluation of magnetic susceptibility of VHTS ceramic materials of this invention. All the existing devices for measuring $T_c$ in the vicinity of 90° K, have a synchronous detector possessing a very narrow transmission band and rely upon cryogenic technology. As is known, measurement of magnetic susceptibility demonstrates the necessary and sufficient condition of proof of the presence of the superconducting phase in the compound under test ("High T Superconductors", edited by D. Nelson et al. 194th meeting of the American Chemical Society, New Orleans, La., Aug. 30–Sep. 4, 1987). The superconductive nature of compounds of the invention at temperatures approaching 210° K and 373° K was shown by observation of the Meissner effect which is evident from the data on magnetic susceptibility. Measuring of magnetic susceptibility was conducted utilizing the measurement system the diagram of which is presented at FIG. 1.

Testing High-T Superconductivity Substances

The circuitry 10 for the equipment used to conduct the tests is schematically shown in FIG. 1. Generically, the structure is:

1. Measurement Bridge for determining inductance (L), capacitance (C) and resistance (R) with digital measurement readout interfacing to a computer 6 for control and data collection and manipulation. Such a measurement apparatus will be familiar to one skilled in the relevant art. The LCR bridge is shown schematically at 1. Also shown are digital voltmeter 5 and thermocouple 4. Voltmeter 5 acts in conjunction with thermocouple 4 to provide temperature measurement and interface as shown interfacing to computer 6 for control and data collection.

2. A thermostatically controlled chamber 2, (volume approximately 10×10×10 cm internally) with heating and cooling capabilities, and the sample 3 wrapped in the bridge coil 7 complete the test Normally, necessary access to electrical connections (not shown) inside and outside of chamber are provided.

Test Setup

The sample-test coil with an inductance of about 7 micro Henry when filled with air at atmospheric pressure is mounted in chamber 2 and used as the control for the test measurements. When testing the material, vial containing the superconducting substance is placed inside coil 7. The coil is connected to the (2-wire) input of the inductance measuring device, with one lead connected via a resistor 8 of about 3 kilo Ohm.

Control Tests

The control for the tests on the superconducting compound was the performance of the same temperature related inductance measurements utilizing the test coil with no material inserted (air filled coil). No significant changes in the inductance of the coil over the temperature range of the tests were measured. The frequency of the alternating current sine-wave signal of the Measurement Bridge was maintained substantially constant throughout all tests at a frequency of 1 MHz. Measurements of resistance were taken by milli-Ohm meter with a resolution of better than 1 milli-Ohm.

Measurements

A computer monitors the temperature and relative inductance of the coil for temperatures above the $T_c$ to temperatures below $T_c$. For conductivity measurements, a tablet made of the same substance is simply heated in the furnace and resistance is measured between the faces of the tablet at various temperatures whereby a sharp change of resistance at $T_c$ is evident, such change being preceded and followed by relatively little change in resistance values. Test times for the measurements of resistance and relative inductance extended over a period of approximately 25 minutes. Test times are largely determined by the heating characteristics of the chamber utilized. An inductive effect was observed in both heating and cooling cycles and a hysteresis loop was noted. The thermal inertia of the overall test system makes the measurement of resistance during the cooling cycle difficult and results refer to heating cycles only.

The Results of the Tests

Figure 2:
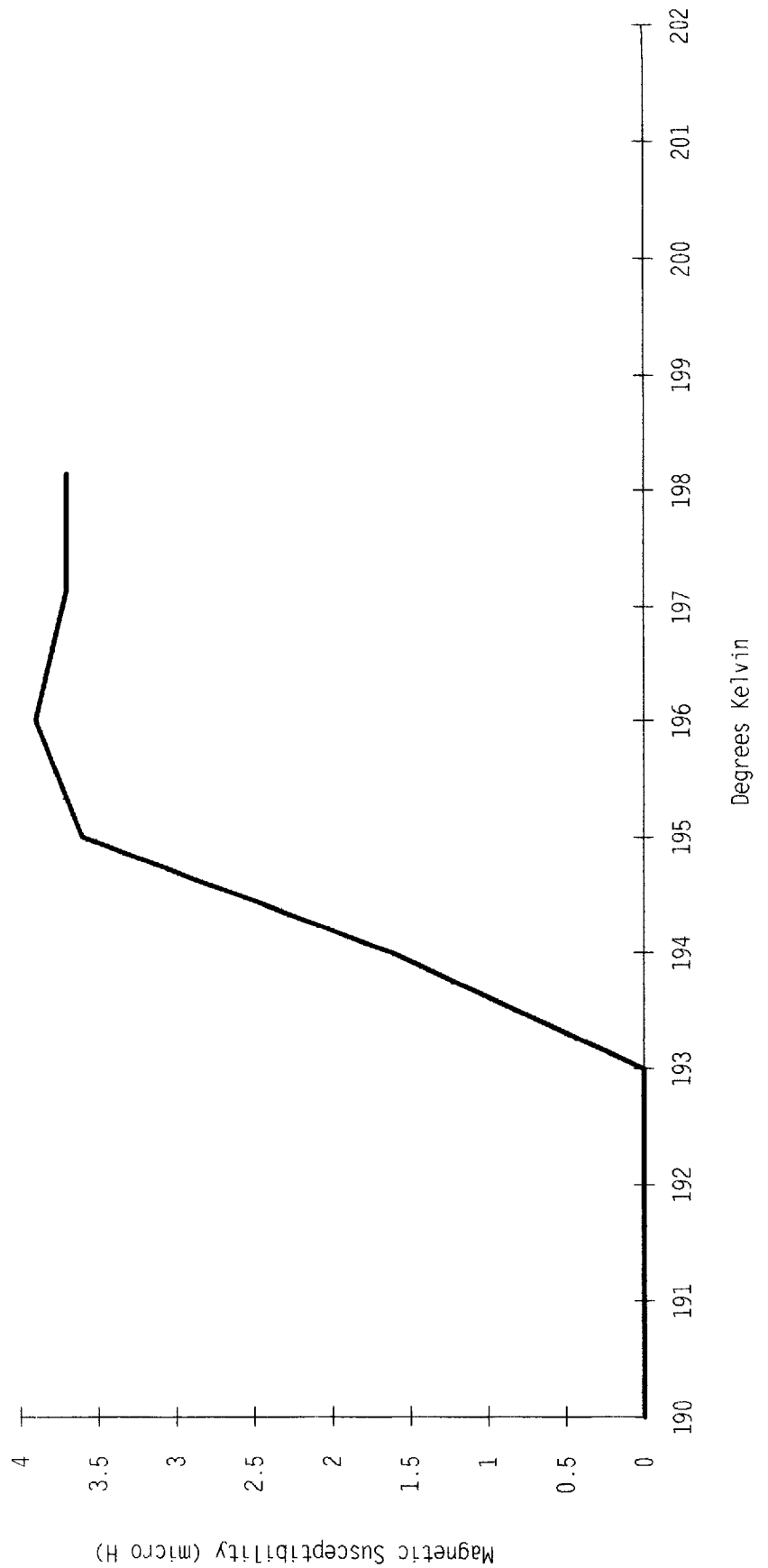
FIGS. 2 and 3 are graphical representations of the correlation between magnetic susceptibility and temperature for compositions of this invention.
Figure 3:
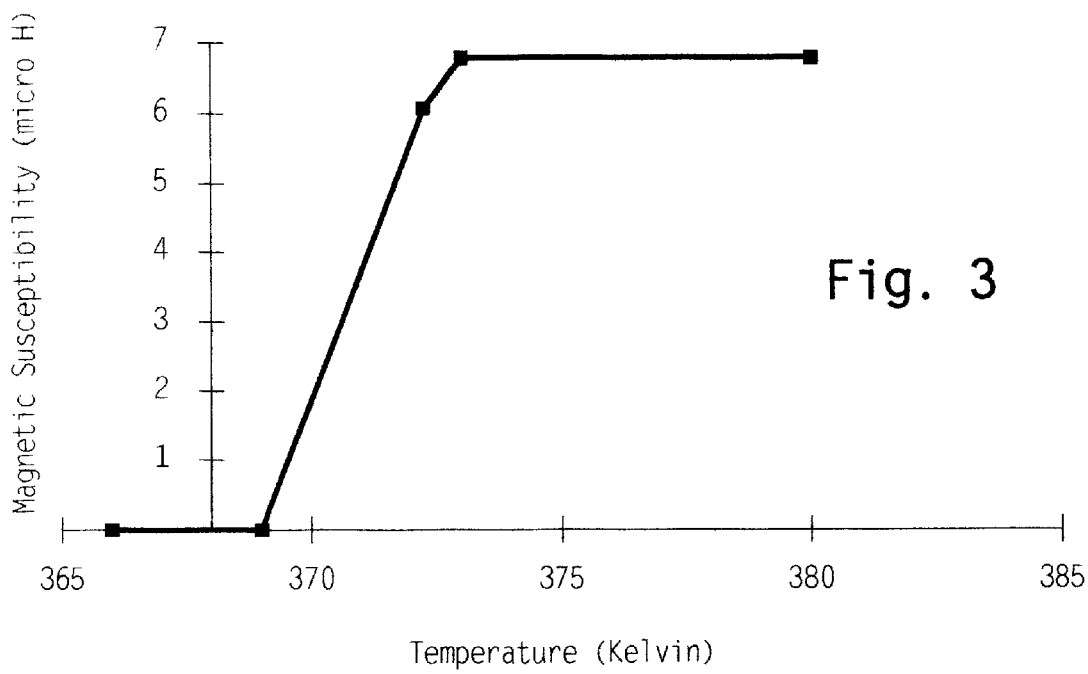
Figure 4:
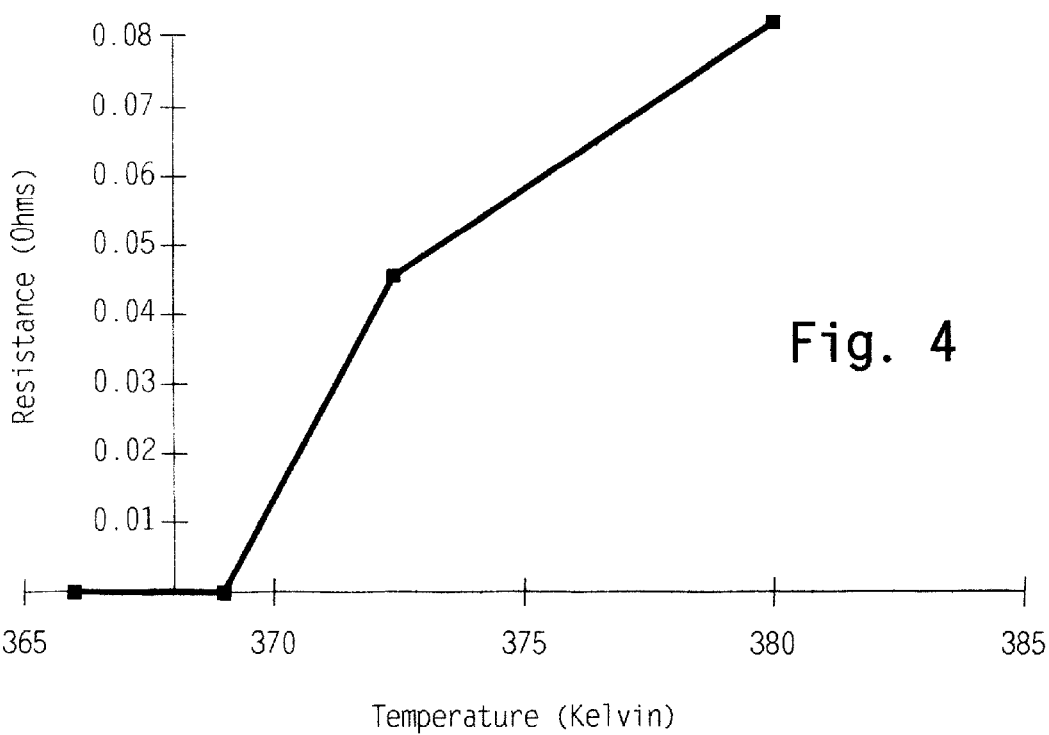
FIG. 4 is a graphical representation of the correlation between resistance and temperature for a composition of this invention.

Magnetic susceptibility of samples prepared as described above was measured according to the above mentioned technique. The results of those studies is as follows:

1. A conventional Y—Ba—Cu—O 1-2-3 (i.e., $YBa_2Cu_3O_7$) system exhibited transfer into a superconductive state at 95 degrees Kelvin.
2. The Y—$Ba_2$—$Ag_3$—$S_7$ system produced from sulphides. Three samples were evaluated. These samples were produced by different technological solutions and without separation. Transfer into a superconductive state was observed at T=195° K (FIG. 2). Au, Cu, Ag, Rb, Cs, K.
3. $YBa_2Ag_3Se_7$ system produced from selenides. Four samples were measured. These samples were produced by different technological solutions and without separation. Transfer into superconductive state in these samples was observed at T=373° K (FIGS. 3 and 4). FIG. 3 indicates Magnetic Susceptibility, FIG. 4 shows resistance.

Qualitative Evaluation

When tablets made from the tested compounds were put into a magnetic field (B=0.3 Tesla), e.g., by suspension, they moved toward the lower intensity (i.e., the lowest strength) part of the field. In other words, the samples, qualitatively exhibited the Meissner effect. These tests were run at atmospheric pressure (1 atm) and temperatures below the relevant $T_c$ of the compounds as measured above.

The above description and examples are intended to be illustrative and not limiting of the present invention. One skilled in the relevant art will appreciate that there may be many variations and alternatives suggested by the above disclosure. Those variations and alternatives are intended to be with the scope of this invention as set forth in the following claims.

What is claimed is as follows:

1. A method of conducting electricity utilizing current carriers, utilizing a ceramic material having a lattice structure, wherein no observable energy interchange occurs between the current carriers and the lattice and wherein the flow of current generates no observable voltage gradient, said method being practiced at a temperature above about 193 degrees K and a pressure of less than about 150,000 atmospheres.

2. A method according to claim 1 wherein the method is practiced at a pressure in the range of 0.5 to 2 atmospheres.

3. A method according to claim 1 wherein the ceramic material comprises selenium.

4. A method of conducting electricity through a ceramic superconductor, the method being practiced at a temperature in excess of 193 degrees K and a pressure in the range of 0.5 to 2.0 atmospheres.

5. A method of conducting electricity utilizing current carriers, utilizing a ceramic material having a lattice structure, wherein no observable energy interchange occurs between the current carriers and the lattice and wherein the flow of current generates no observable voltage gradient, said method being practiced at a temperature above about 193 degrees K and a pressure in the range of 0.5 to 2 atmospheres, the ceramic material comprising:

$$YBa_2M_3Se_{a-b}$$

wherein:

M is Ag, Cu, or mixtures thereof;

and wherein a is an integer having a value between 2 and 10, and b is in the range of about 0 to about 0.5.

6. A method according to claim 5 wherein subscript a has a value in the range of 5 through 8.

7. A method according to claim 5 wherein subscript a has a value of 7.

8. A method according to claim 5 wherein M is Cu.

9. A method according to claim 5 wherein M is Ag.

10. A method according to claim 9 wherein subscript a has a value of in the range of 5 through 8.

11. A method according to claim 9 wherein subscript a has a value of 7.

* * * * *